(12) United States Patent
Chang et al.

(10) Patent No.: US 7,033,902 B2
(45) Date of Patent: Apr. 25, 2006

(54) METHOD FOR MAKING THIN FILM TRANSISTORS WITH LIGHTLY DOPED REGIONS

(75) Inventors: Shih-Chang Chang, Hsinchu (TW);
De-Hua Deng, Taoyuan (TW);
Yaw-Ming Tsai, Taichung (TW)

(73) Assignee: Toppoly Optoelectronics Corp., (TW)

( * ) Notice: Subject to any disclaimer, the term of this patent is extended or adjusted under 35 U.S.C. 154(b) by 0 days.

(21) Appl. No.: 10/947,210

(22) Filed: Sep. 23, 2004

(65) Prior Publication Data

US 2006/0063343 A1 Mar. 23, 2006

(51) Int. Cl.
*H01L 21/331* (2006.01)
*H01L 21/00* (2006.01)
*H01L 21/84* (2006.01)

(52) U.S. Cl. .................. 438/369; 438/149; 438/153; 438/162

(58) Field of Classification Search ................ 438/369, 438/153, 161, 174, 181, 149, 162, 390, 401, 438/519
See application file for complete search history.

(56) References Cited

U.S. PATENT DOCUMENTS

| 5,643,801 | A | * | 7/1997 | Ishihara et al. .......... 250/492.1 |
| 6,108,056 | A | * | 8/2000 | Nakajima et al. ............. 349/38 |
| 6,114,715 | A | * | 9/2000 | Hamada ....................... 257/72 |
| 6,130,119 | A | * | 10/2000 | Jinnai ......................... 438/155 |
| 6,544,825 | B1 | * | 4/2003 | Yamazaki .................... 438/162 |
| 6,950,220 | B1 | * | 9/2005 | Abramson et al. .......... 359/265 |
| 6,953,951 | B1 | * | 10/2005 | Yamazaki et al. ............. 257/72 |
| 6,955,578 | B1 | * | 10/2005 | Park et al. ...................... 445/3 |
| 6,958,750 | B1 | * | 10/2005 | Azami et al. ................ 345/204 |
| 2002/0158995 | A1 | * | 10/2002 | Hwang et al. ................. 349/43 |
| 2003/0124778 | A1 | * | 7/2003 | Doi et al. .................... 438/151 |
| 2003/0211664 | A1 | * | 11/2003 | Fujimoto et al. ........... 438/149 |

* cited by examiner

*Primary Examiner*—Chuong Anh Luu
(74) *Attorney, Agent, or Firm*—Harness, Dickey & Pierce, P.L.C.

(57) ABSTRACT

A method for making a thin film transistor (TFT) with a lightly doped region. The process of the invention is compatible with the currently common TFT manufacturing processes. A substrate with a photoresist layer thereon is subjected to two-step exposure with different exposure energies to form a full-through pattern and a non-through pattern after development. The same photoresist layer is subjected to two etching steps to form a gate region and an intra-gate region. The gate region and the intra-gate region are respectively doped with different dopant concentrations. Therefore, the number of times forming and exposing the photoresist layer is reduced.

17 Claims, 5 Drawing Sheets

METHOD FOR MAKING THIN FILM TRANSISTORS WITH LIGHTLY DOPED REGIONS

BACKGROUND OF THE INVENTION

1. Field of Invention

This invention relates to a method for making a thin film transistor. In particular, this invention relates to a method for making thin film transistors with lightly doped regions.

2. Related Art

Thin film transistor (TFT) liquid crystal displays (LCD) have been widely used as display devices. As the LCD technology progresses, competition between LCD manufacturers is increasingly keen. To increase the performance of the TFT-LCD, a higher reliability and a cost down of manufacturing the TFT-LCD are the main challenges for TFT manufacturers. The TFT performance is usually improved by modification of its structure and material. The leakage current of the TFT is the main reason of great power consumption. Therefore, it is a critical issue to reduce the leakage current in the TFT. The use of silicon insulation and high-dielectric gate, for example, are well known to obtain a low-leakage TFT. A dual gate structure with a lightly doped intra-gate region has been proposed in the art to achieve the above purpose while further reducing the transversal resistance. This solution has been widely used in the TFT manufacturing field.

A method for making a high-performance TFT includes the steps of exposure, development and etching. For example, a commonly used self-alignment process requires complex etching steps to form a gate. Furthermore, photolithography processes and ion implantations with different dopant concentrations are also required to form heavily doped regions and lightly doped regions in the gate, which complicates the gate manufacture process and thus lowers the throughput.

SUMMARY OF THE INVENTION

In order to simplify the TFT process with high performance, this invention provides a method for making a thin film transistor with lightly doped regions. The process includes exposure with two exposure energies and a step of development to define patterns having different depths. In the formation of a gate, the photoresist layer is etched twice. At the first etching, a heavily doped region is formed. A source region and a drain region are doped with high dopant concentrations. At the second etching, a lightly doped region is formed. Then, a light doping is performed on the lightly doped region. Therefore, the number and exposure time of forming the photoresist layers are reduced. Furthermore, the process of the invention is compatible with the currently common manufacturing processes.

The exposure steps with two different exposure energies form the patterns with different depths for use in individual etching steps.

The gate is formed by the following steps. A substrate with a semiconductor material layer is provided. An insulation layer is formed over the semiconductor material layer. A conductive layer and a photoresist layer are sequentially formed over the insulation layer. A first exposure energy and a second exposure energy are applied to the photoresist layer to respectively form a first exposed region and a second exposed region. The first exposure energy is different from the second exposure energy.

A development process is performed on the photoresist layer to form a full-through pattern and a non-through pattern. The full-through pattern exposes the underlying conductive layer while the non-through pattern doesn't. Then, a first portion of the conductive layer exposed through the full-through pattern and the gate insulation layer underneath the first portion of the conductive layer are removed by etching to define a heavily doped region. The source region and the drain region of the semiconductor material layer are doped at high dopant concentration to form a source and a drain. The non-through pattern is removed to expose a second portion of the conductive layer. The exposed second portion of the conductive layer is removed to expose a lightly doped region. Thereafter, the lightly doped region of the conductive layer is lightly doped. Finally, the photoresist layer is removed.

In the above process, the photoresist layer is applied with two exposure energies to form two patterns with different depth by two steps of exposure for respectively defining the heavily doped region and the lightly doped region. Alternatively, a phase-shift mask with different transmission is subject to one-step exposure to form a fully exposed region and a partially exposed region that respectively form the full-through pattern and the non-through pattern for defining the heavily and lightly doped regions.

When the current process forms a complemental metal oxide semiconductor (CMOS) TFT device with a lightly doped region, a plurality of photolithgraphy processes are required to define a heavily doped region and a lightly doped region of n-channel MOS. However, only one photoresist layer is required to define regions with different dopant concentrations. Therefore, the number of times performing the photolithograpy process is reduced, the manufacture yield is increased, and the manufacture speed is also increased.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow illustration only, and thus are not limitative of the present invention, and wherein.

DETAILED DESCRIPTION OF THE INVENTION

In a first embodiment of the invention, a MOS device with a dual gate and an intra-gate region is formed. FIG. 1 to FIG. 8 are schematic views illustrating the process of forming the MOS device according to the first embodiment of the invention.

Figure 1:
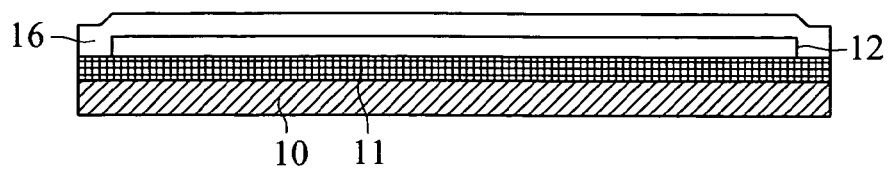
FIG. 1 to FIG. 8 are schematic views illustrating a process of forming a MOS device according to a first embodiment of the invention.

Referring to FIG. 1, a substrate 10 with a buffer layer 11 thereon is provided. A polysilicon layer 12 is formed on the buffer layer 11. A gate insulation layer 16 is formed over the buffer layer 11 to cover the polysilicon layer 12. The polysilicon layer 12 includes a source region and a drain region.

Figure 2:
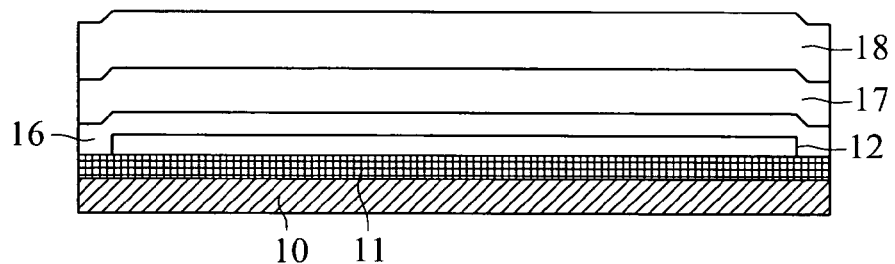

Referring to FIG. 2, a conductive layer 17 and a photoresist layer 18 are sequentially formed on the gate insulation layer 16. The gate insulation layer 16 has a thickness in the range of 200 to 2000 angstroms.

Then, a photolithography process is preformed. A positive type photoresist material is applied over the conductive layer 17 to form the photoresist layer 18. The substrate 10 is sequentially subjected to two exposures by using two photomasks. The first photomask 21 is used to define a gate electrode. The second photomask 22 is used to define a dual gate and an intra-gate region.

Figure 3:
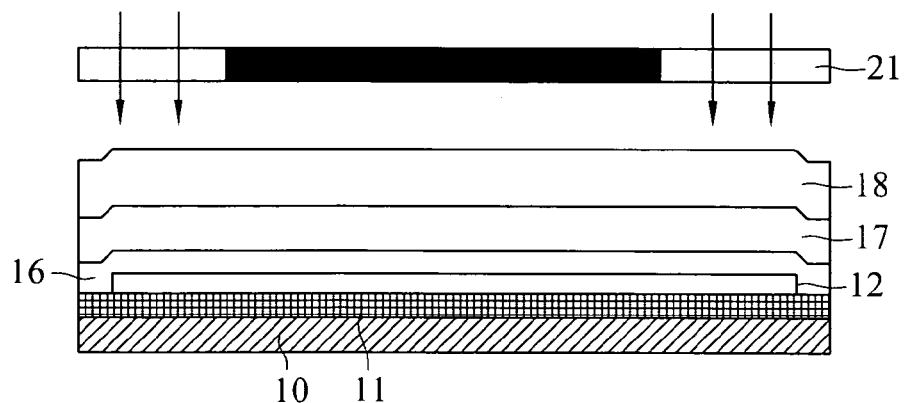

Referring to FIG. 3, the photoresist layer 18 is covered with the first photomask 21 and then exposed with the first exposure energy to form a first exposure region.

Figure 4:
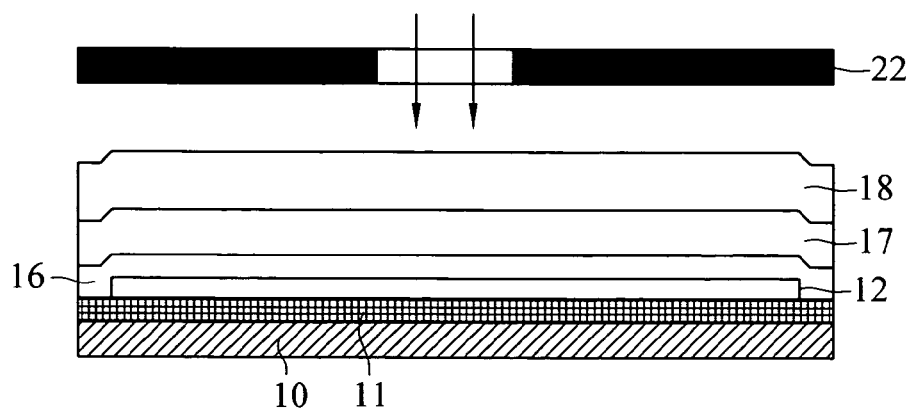

Referring to FIG. 4, the photoresist layer 18 is covered with the second photomask 22 and then exposed with the second exposure energy to form a second exposure region.

Figure 5:
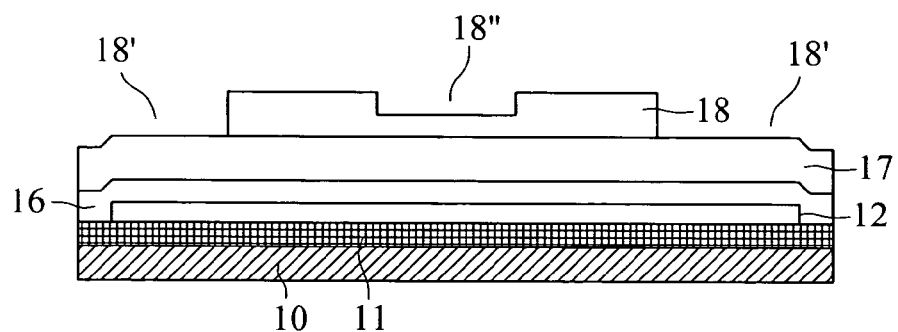

Referring to FIG. 5, the photoresist layer 18 is then subjected to development. Since the first and second energy are different, the first and second exposure regions after the development process respectively form a full-through pattern and a non-through pattern. The full-through pattern here is referred to as a first region 18'. The non-through pattern here is referred to as a second region 18".

Figure 6:
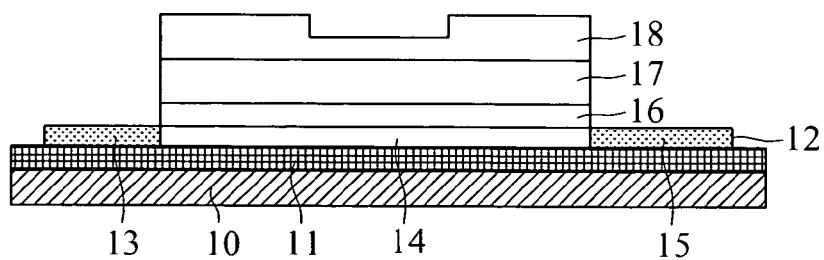

Referring to FIG. 6, the substrate 10 is subjected to two etching steps. At the first etching step, a first portion of the conductive layer 17 exposed through the first region 18' and the gate insulation layer 16 underneath the first portion of the conductive layer 17 are etched. Thereafter, the source region and the drain region of the polysilicon layer 12 are doped at high dopant concentration to form a source 13 and a drain 15.

Figure 7:
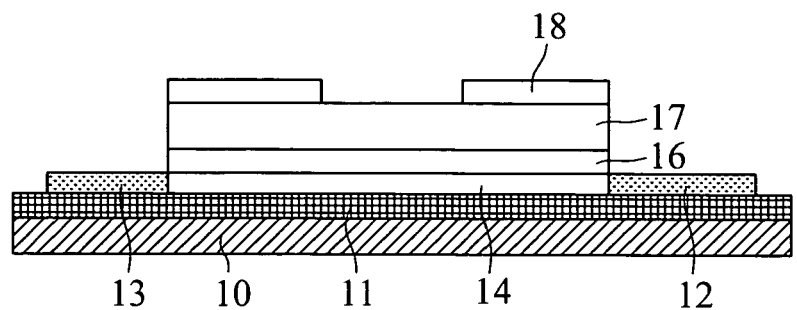

Referring to FIG. 7, the photoresist layer 18 is ashed by oxygen plasma to remove the second region 18" in order to expose a second portion of the conductive layer 17.

Figure 8:
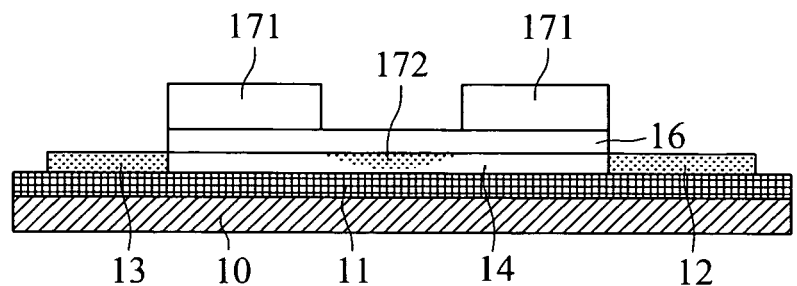

Referring FIG. 8, the second portion of the conductive layer 17 is etched to define a dual gate 171 and an intra-gate region 172. An ion implantation with low dopant concentration is performed. Then, the photoresist layer 18 is removed. The gate is thereby achieved.

Thereafter, a plurality of processing steps is performed to achieve the MOS device of the first embodiment of the invention.

Figure 9:
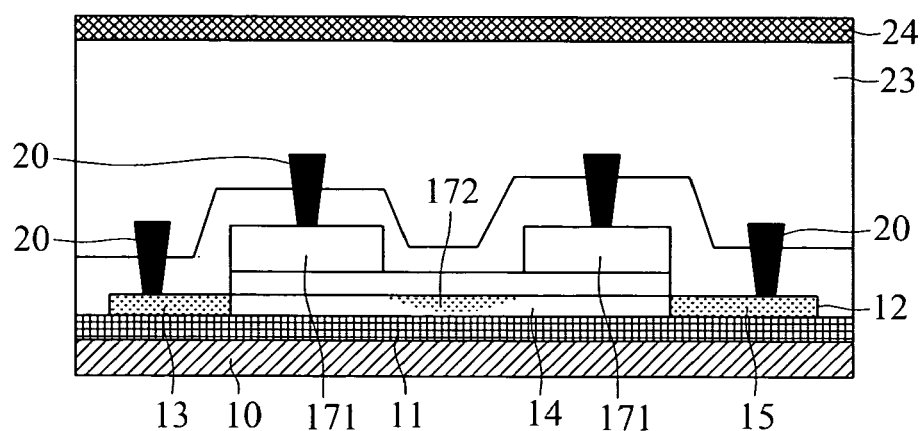
FIG. 9 is a schematic view of a NMOS device formed according to a first embodiment of the invention.

FIG. 9 is a schematic view of a NMOS device formed according to a first embodiment of the invention. An insulative cap layer 19 is formed over the dual gate 171, the source 13 and the drain 15. A photolithography process is performed on the insulative cap layer 19 to form a gate through hole, a source through hole and a drain through hole. A metal material fills the above through holes to form a plurality of conductive electrodes 20. Finally, a fill-up layer 23 and a transparent conductive layer 24 are sequentially formed.

A phase-shift mask including a plurality of different-transmission regions can be also used in the exposure process of the invention to define a plurality of doped regions with different dopant concentrations.

FIG. 10 to FIG. 15 are schematic views illustrating a process of forming a thin film transistor with lightly doped regions according to a second embodiment of the invention, which shows the formation of a lightly doped drain (LDD).

Figure 10:
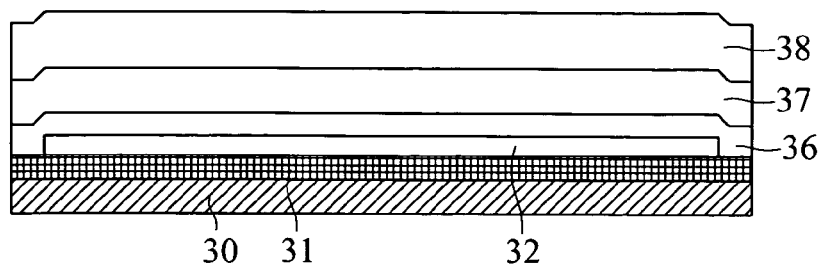
FIG. 10 to FIG. 15 are schematic views illustrating a process of forming a thin film transistor with lightly doped regions according to a second embodiment of the invention.

Referring to FIG. 10, a substrate 30 with a buffer layer 31, a polysilicon layer 32 is sequentially formed thereon. A gate insulation layer 36 is formed over the buffer layer 31 to cover the polysilicon layer 32. The polysilicon layer 32 has a source region and a drain region to be formed. A conductive layer 37 is formed over the gate insulation layer 36. The thickness of the gate insulation layer 36 is in the range of 200 to 2000 angstroms. A positive type photoresist material is applied over the conductive layer to form a photoresist layer 38. Then, a photolithography process is performed.

In the second embodiment of the invention, the phase-shift mask 40 is used in the exposure process. The phase-shift mask 40 has a first transmit region 41 and a second transmit region 42 that has a transmission different from the first transmit region 41. The first transmit region 41 is used to define a heavily doped source/drain. The second transmit region 42 is used to define a lightly doped drain region.

Figure 11:
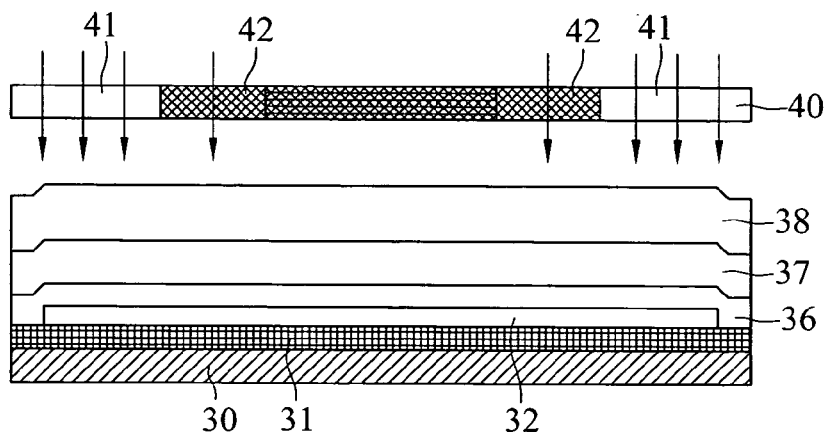

Referring to FIG. 11, the photoresist layer 38 is subjected to the exposure process by using the phase-shift mask 40. Meanwhile, high exposure energy and low exposure energy are applied to respectively form a first exposed region and a second exposed region.

Figure 12:
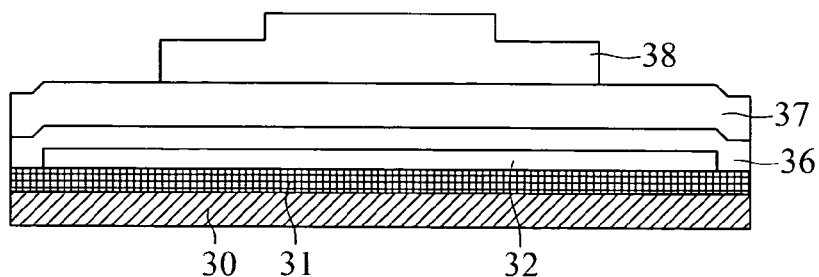

Referring to FIG. 12, the exposed photoresist layer 38 is developed. A full-through region 38' and a non-through region 38" are formed due to the difference of the exposure energies.

Figure 13:
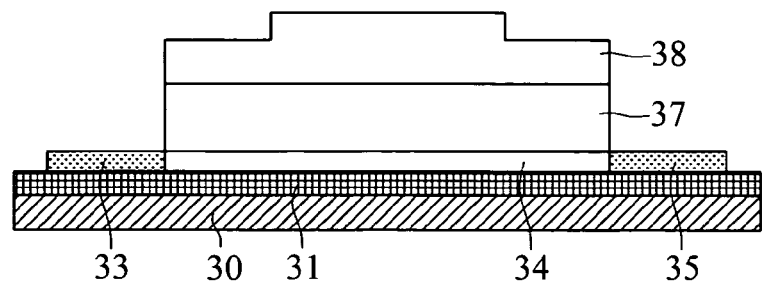

Referring to FIG. 13, two etching steps are sequentially performed. At the first etching step, a first portion of the conductive layer 37 exposed in the first region 38' and the gate insulation layer 36 beneath the first portion of the conductive layer 37 are sequentially etched to expose a source/drain region in the polysilicon layer 32. Thereafter, the source region and the drain region of the polysilicon layer 32 are doped at high dopant concentration to form a source 33 and a drain 35.

Figure 14:
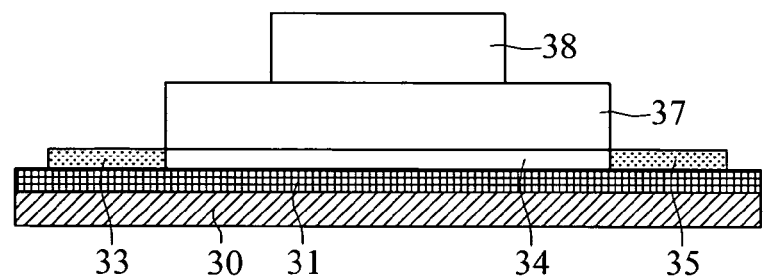

Referring to FIG. 14, the photoresist layer 38 is ashed by oxygen plasma to remove the second region 38" and thereby exposing a second portion of the conductive layer 37.

Figure 15:
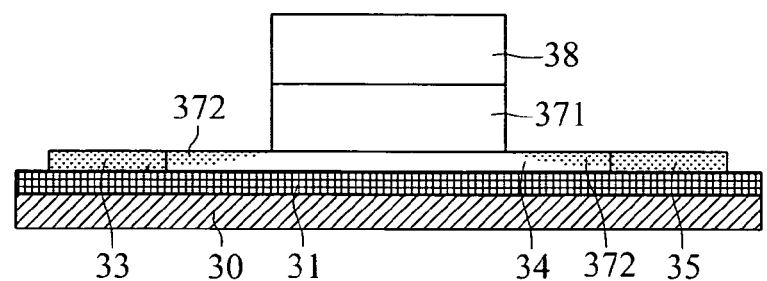

Referring to FIG. 15, the second portion of the conductive layer 37 and the gate insulation layer 36 beneath the second portion of the conductive layer 37 is etched to define a gate 371 and exposing a low doping drain/source region 372 in the semiconductor material layer. Ion implantation with low dopant concentration is performed. Then, the photoresist layer 38 is removed. The gate is thereby achieved.

In the invention, two photomasks or the phase-shift mask can be used in one or both of the etching steps. The photoresist material is not limited to the positive type photoresist material. A negative type photoresist material can be also used. The location of the substrate subjected to the exposure and the energy for exposure can be adjusted as desired.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for making a thin film transistor with lightly doped regions, comprising:
   providing a substrate with a semiconductor material layer;
   forming an insulation layer over the semiconductor material layer;
   forming a conductive layer over the insulation layer;
   forming a photoresist layer over the conductive layer;

applying a first exposure energy to the photoresist layer to form a first exposed region;
applying a second exposure energy to the photoresist layer to form a second exposed region, wherein the first exposure energy is different from the second exposure energy;
performing a development process on the photoresist layer to form a full-through pattern and a non-through pattern;
etching a first portion of the conductive layer exposed through the full-through pattern and the gate insulation layer underneath the first portion of the conductive layer, and thereby exposing a source and a drain region in the semiconductor material layer to be formed;
doping the source region and the drain region of the semiconductor material layer at high dopant concentration to form a source and a drain;
removing the non-through pattern to expose a second portion of the conductive layer;
etching the exposed second portion of the conductive layer to expose a lightly doped region; and
lightly doping in the lightly doped region of the conductive layer.

2. The method for making a thin film transistor with lightly doped regions of claim 1, wherein the gate is a duel gate.

3. The method for making a thin film transistor with lightly doped regions of claim 1, wherein the lightly doped region is an intra-gate region.

4. The method for making a thin film transistor with lightly doped regions of claim 1, wherein the lightly doped region is a lightly doped drain region.

5. The method for making a thin film transistor with lightly doped regions of claim 1, wherein the thickness of the insulation layer is in a range of 200 to 2000 angstroms.

6. The method for making a thin film transistor with lightly doped regions of claim 1, wherein the step of removing the non-through pattern of the photoresist layer is achieved by ashing the photoresist layer by using oxygen plasma.

7. The method for making a thin film transistor with lightly doped regions of claim 1, wherein a buffer layer is further formed between the substrate and the semiconductor material layer.

8. The method for making a thin film transistor with lightly doped regions of claim 1, wherein the semiconductor material layer is a polysilicon layer.

9. A method for making a thin film transistor with lightly doped regions, comprising:
providing a substrate with a semiconductor material layer, wherein the semiconductor material layer includes a source region and a drain region;
forming an insulation layer over the semiconductor material layer;
forming a conductive layer over the insulation layer;
forming a photoresist layer over the conductive layer;
applying a first exposure energy and a second exposure energy to the photoresist layer at the same time to form a first exposed region and a second exposed region, wherein the first exposure energy is different from the second exposure energy;
performing a development process on the photoresist layer to form a full-through pattern and a non-through pattern;
etching a first portion of the conductive layer exposed through the full-through pattern and the gate insulation layer underneath the first portion of the conductive layer;
doping the source region and the drain region of the semiconductor material layer at high dopant concentration to form a source and a drain;
removing the non-through pattern to expose a second portion of the conductive layer;
etching the exposed second portion of the conductive layer to expose a lightly doped region; and
lightly doping in the lightly doped region of the conductive layer.

10. The method for making a thin film transistor with lightly doped regions of claim 9, wherein the gate is a duel gate.

11. The method for making a thin film transistor with lightly doped regions of claim 9, wherein the lightly doped region is an intra-gate region.

12. The method for making a thin film transistor with lightly doped regions of claim 9, wherein the lightly doped region is a lightly doped drain (LDD) region.

13. The method for making a thin film transistor with lightly doped regions of claim 9, wherein the thickness of the insulation layer is in a range of 200 to 2000 angstroms.

14. The method for making a thin film transistor with lightly doped regions of claim 9, wherein the first and second exposure energies are generated by means by allowing a light source travel through a phase-shift mask.

15. The method for making a thin film transistor with lightly doped regions of claim 9, wherein the step of removing the non-through pattern of the photoresist layer is achieved by ashing the photoresist layer by using oxygen plasma.

16. The method for making a thin film transistor with lightly doped regions of claim 9, wherein a buffer layer is further formed between the substrate and the semiconductor material layer.

17. The method for making a thin film transistor with lightly doped regions of claim 9, wherein the semiconductor material layer is a polysilicon layer.

* * * * *